United States Patent [19]
Ono

[11] Patent Number: 4,894,541
[45] Date of Patent: Jan. 16, 1990

[54] APPARATUS UTILIZING CHARGED-PARTICLE BEAM

[75] Inventor: Akishige Ono, Tokyo, Japan

[73] Assignee: JEOL Ltd., Tokyo, Japan

[21] Appl. No.: 225,342

[22] Filed: Jul. 28, 1988

[30] Foreign Application Priority Data

Jul. 31, 1987 [JP] Japan ................................ 62-192098

[51] Int. Cl.$^4$ ............................................ H01J 37/256
[52] U.S. Cl. ...................................... 250/310; 250/306
[58] Field of Search ...................... 250/306, 310, 492.1, 250/398

[56] References Cited

U.S. PATENT DOCUMENTS

| | | | |
|---|---|---|---|
| 4,233,510 | 11/1980 | Sato | 250/306 |
| 4,547,669 | 10/1985 | Nakagawa et al. | 250/310 |
| 4,604,523 | 8/1986 | Knowles et al. | 250/310 |
| 4,791,295 | 12/1988 | Yamada | 250/306 |
| 4,820,977 | 4/1989 | Brust | 250/310 |
| 4,827,127 | 5/1989 | Todokoro | 250/310 |
| 4,829,243 | 5/1989 | Woodard, Sr. et al. | 250/310 |
| 4,831,267 | 5/1989 | Brunner | 250/310 |

*Primary Examiner*—Janice A. Howell
*Assistant Examiner*—K. Nguyen
*Attorney, Agent, or Firm*—Webb, Burden, Ziesenheim & Webb

[57] ABSTRACT

In an apparatus irradiating a specimen with a scanning charged-particle beam to detect x-rays or backscattered electrons emanating from the specimen to display an image thereof on a viewing screen, the beam is fixed on a certain point on the specimen to analyze only that region. The size of the analyzed region is indicated on the viewing screen by a circle, for example, and this circle is superimposed on the image of the specimen. The size of the circle is determined from the accelerating voltage at which the beam is accelerated, the magnification of the image of the specimen, and the mean atomic number of the specimen.

4 Claims, 3 Drawing Sheets

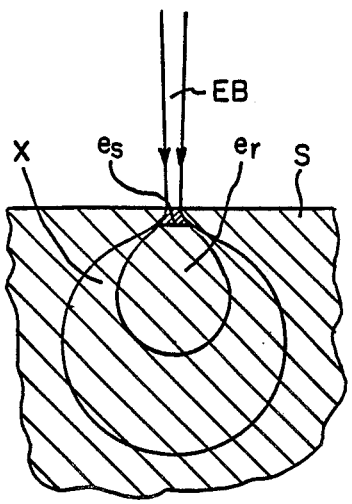
Fig. 1
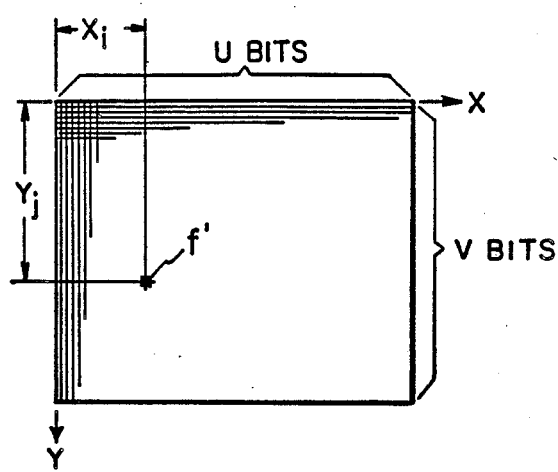
Fig. 3(a)
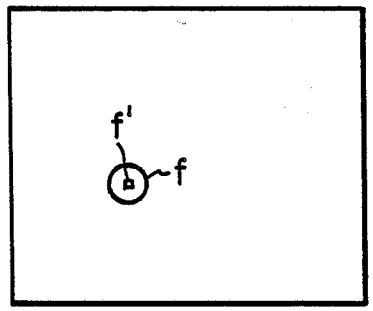
Fig. 3(b)
Fig. 5
| Z | E | r |
|---|---|---|
| $Z_1$ | $E_1$ | $r_{11}$ |
| $Z_1$ | $E_2$ | $r_{12}$ |
| $Z_1$ | $E_3$ | $r_{13}$ |
| | | |
| $Z_2$ | $E_1$ | $r_{21}$ |
| $Z_2$ | $E_2$ | $r_{22}$ |
| | | |
| $Z_i$ | $E_j$ | $r_{ij}$ |
| | | |
| $Z_m$ | $E_1$ | $r_{m1}$ |
| $Z_m$ | $E_2$ | $r_{m2}$ |
| | | |
| $Z_m$ | $E_n$ | $r_{mn}$ |

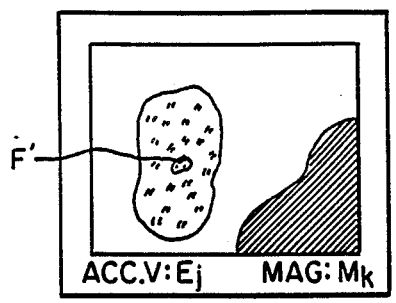
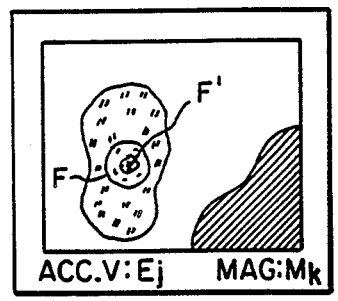
Fig. 6(a)　　　Fig. 6(b)
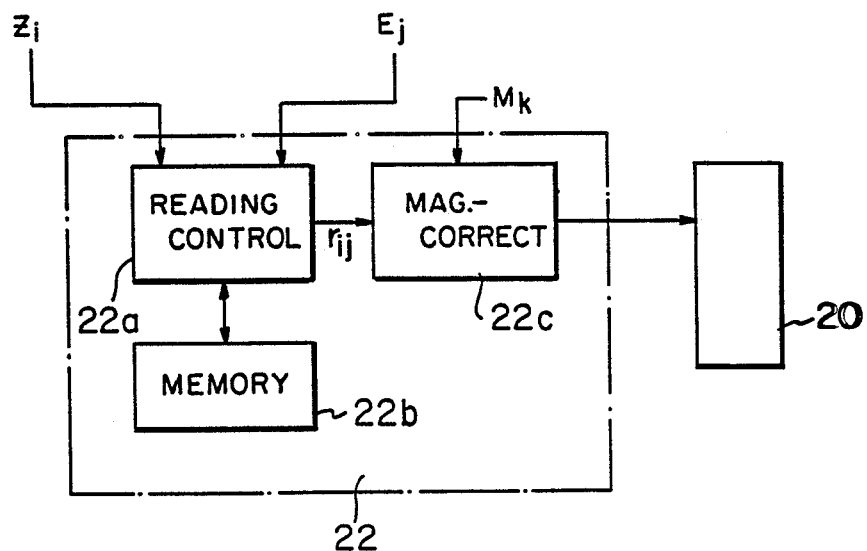
Fig. 4

APPARATUS UTILIZING CHARGED-PARTICLE BEAM

BACKGROUND OF THE INVENTION

The present invention relates to an apparatus utilizing a charged-particle beam to analyze a specimen such as an electron probe microanalyzer.

In conventional electron probe microanalysis, an image of a specimen such as an image produced from secondary electrons is displayed on the viewing screen of a CRT. A mark consisting of dots is superimposed on the image of the specimen to specify or indicate the analysis point.

The aforementioned image of the specimen is obtained by scanning the electron beam while the electron probe microanalyzer is in scanning mode. The operator observes the image of the specimen and looks for a location of concern. Then the operator moves the mark to specify an analyzed point with the mark.

If the operator subsequently shifts the analyzer from scanning mode to analysis mode, then the electron beam is fixed on a point on the specimen which corresponds to the position on the specimen image specified by the mark. The electrons strike the specimen at the analyzed point and diffuse into the specimen. X-rays, secondary electrons, backscattered electrons, etc., are emitted until the energy of the incident electron is lost.

FIG. 1 is a cross-sectional view of a specimen, taken across an analyzed point. Some regions from which x-rays or electrons as described above are emitted are shown. The specimen and an incident electron beam are denoted by S and EB, respectively. Secondary electrons are emitted from a region, $e_s$. Backscattered electrons emanate from a region $e_r$. X-rays are produced from a region x. In electron probe microanalysis, the intensity and the wavelengths of x-rays generated from the region x are analyzed and so the region x undergoes analysis. As can be seen from FIG. 1, the region x producing x-rays are generally considerably larger than the other regions $e_s$ and $e_r$ producing secondary electrons and backscattered electrons. It is known that the size of the x-ray emission region x varies greatly, depending on the voltage at which the incident electron beam EB is accelerated and also on the mean atomic number of the constituents of the specimen S. The region $e_r$ emitting backscattered electrons has a similar but more moderate tendency.

A secondary electron image or a backscattered electron image is normally employed as a specimen image to look for a region to be analyzed. Since the secondary electron emissive region $e_s$ and the backscattered electron emissive region $e_r$ are smaller than the x-ray emissive region x as described above, the specimen image is created with a resolution higher than the spatial resolution of x-ray analysis. The aforementioned mark superimposed on such a high-resolution specimen image has only a given size. Therefore, the mark provides no information about the size of the analyzed region, though the mark indicates the position of the analyzed region.

SUMMARY OF THE INVENTION

It is an object of the invention to provide an apparatus which utilizes a charged-particle beam and permits one to know the size of an analyzed region.

According to the invention a mark superimposed on an image of a specimen takes the form of a circle, for example, and represents the size of an analyzed region as well as the position of the region. The size of the region is determined by the voltage at which the electron beam is accelerated, and the mean atomic number of the specimen. Then, the mark is superimposed on the specimen image with the size considering the size of the analysis region and the magnification of the specimen image.

Briefly, this invention relates to apparatus utilizing a charged-particle beam for scanning a specimen in a two-dimensional manner and displaying an image of the specimen on a display device such as a CRT viewing screen. It further comprises a position-specifying circuit which permits the specification of a desired position within the image of the specimen to be displayed on the viewing screen, preferably by displaying a first mark upon the screen indicating the position. Circuits are provided for fixing the charged-particle beam on the position on the specimen according to a signal from the position-specifying circuit. A circuit is provided for switching the accelerating voltage at which the beam is accelerated to another value.

A detector detects the x-rays or backscattered electrons emitted from the specimen in response to the irradiation of the fixed beam. A second mark display circuit is provided to superimpose a second mark indicating the position and the size of an analyzed region on the image of the specimen displayed on the viewing screen according to the accelerating voltage and information indicating the mean atomic number of the specimen.

In a preferred embodiment, electronic memory stores a table of various combinations of values of the accelerating voltage, the mean atomic number, and the size of the region producing x-rays or backscattered electrons. Information about the size of the analyzed region is read from the table in response to the combination of the information indicating the accelerating voltage and the information indicating the mean atomic number of the specimen. The second mark display circuit represents the size of the analyzed region according to the information read from the memory.

Other objects and features of the invention will appear in the course of description thereof which follows.

BRIEF DESCRIPTION OF THE DRAWINGS

FIG. 1 is a diagram of a specimen irradiated with an electron beam, for illustrating the sizes of regions emitting x-rays, secondary electrons, and backscattered electrons in response to the irradiation;

FIGS. 3(a) and 3(b) are representations of the memory 19 shown in FIG. 2, for illustrating the contents of the memory;

FIG. 4 is a block diagram of the circuit 22 shown in FIG. 2;

FIG. 5 is a representation of a table stored in the memory 22b shown in FIG. 4; and FIGS. 6(a) and 6(b) are diagrams of marks displayed on the viewing screen of the CRT shown in FIG. 2.

DESCRIPTION OF THE PREFERRED EMBODIMENT

Figure 2:
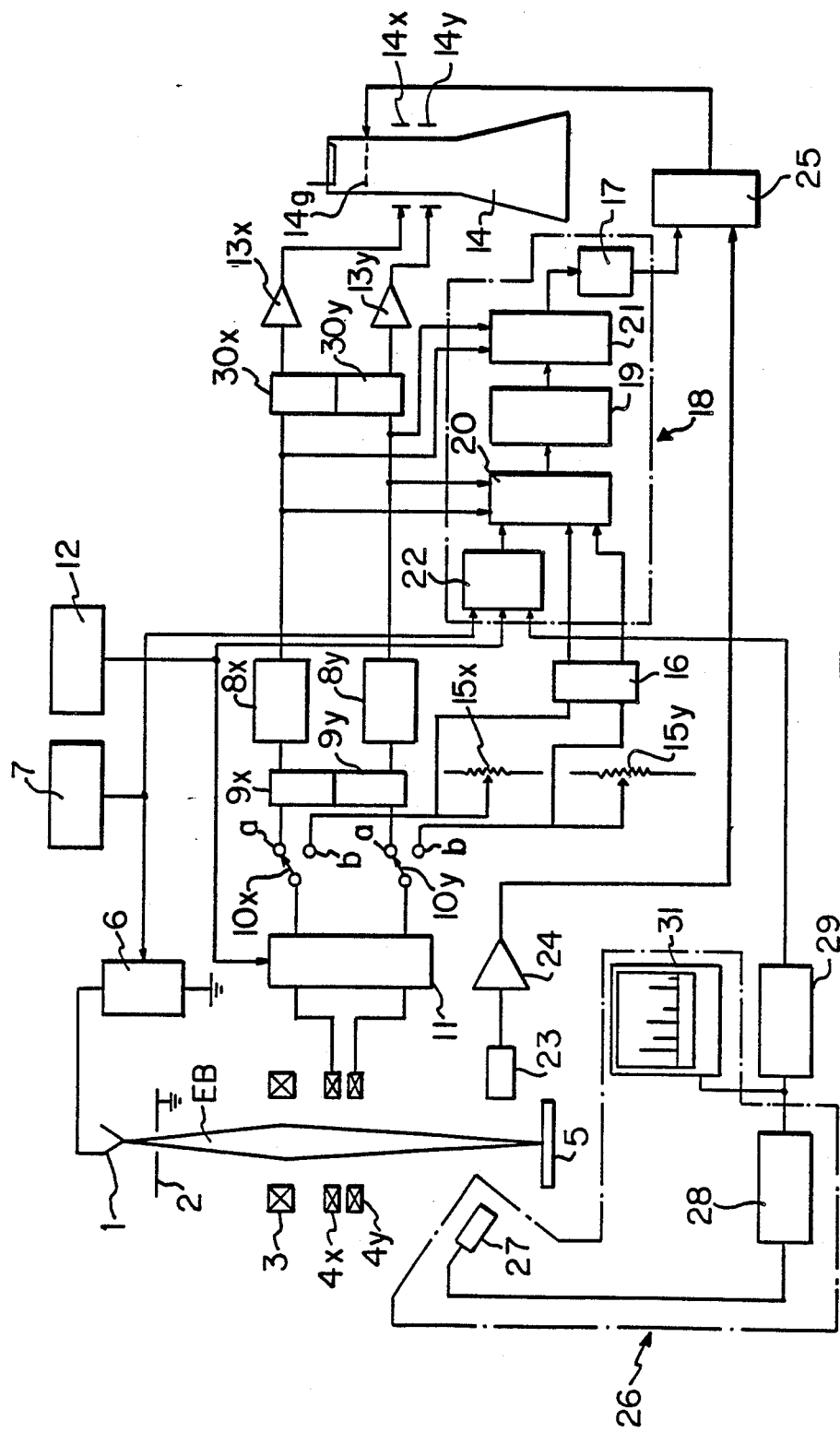
FIG. 2 is a block diagram of an apparatus according to the invention.

Referring to FIG. 2, there is shown an apparatus according to the present invention. This apparatus includes an electron gun 1 that produces an electron beam EB. This beam is finely focused onto a specimen 5 by a condenser lens 3. The position at which the beam strikes the specimen can be set at will, using deflectors 4x and 4y. An accelerating voltage-selecting circuit 7 produces a signal indicating the accelerating voltage to an accelerating voltage source 6. This voltage source 6 produces an accelerating voltage which is applied between the electron gun 1 and an anode 2. Digital scanning circuits 8x and 8y produce scanning signals which are supplied to the deflectors 4x and 4y, respectively, via digital-to-analog converters 9x, 9y, signal-selecting circuits 10x, 10y, and a magnification-switching circuit 11. A magnification-selecting circuit 12 supplies a signal indicative of the magnification to the magnification-switching circuit 11.

The scanning signals produced by the digital scanning circuits 8x and 8y are also fed to the deflectors 14x and 14y, respectively, of a CRT 14 via digital-to-analog converters 30x, 30y and deflection amplifiers 13x, 13y, respectively. Potentiometers 15x and 15y produce signals for specifying an analysis point.

The signals from the potentiometers 15x and 15y are furnished to the signal-selecting circuits 10x and 10y, respectively, and also to a mark display circuit 18 via an analog-to-digital converter 16. The mark display circuit 18 comprises a memory 19 for storing marks, a writing control circuit 20, a reading control circuit 21, a circuit 22 for producing a signal indicative of a radius value, and a digital-to-analog converter 17. The output signal from the display circuit 18 is supplied to the control grid 14g of the CRT 14 via an adder circuit 25. The scanning circuits 8x and 8y supply signals synchronized with scans made along X- and Y-axes, respectively, to the writing control circuit 20 and the reading control circuit 21.

The image of the specimen displayed on the CRT 14 consists of U pixels (X-direction)×V pixels (Y-direction). Correspondingly, a memory plane consisting of U bits (X-direction)×V bits (Y-direction)×1 bit (depth) is set in the memory 19 as shown in FIG. 3(a).

The circuit 22 for producing a signal indicative of a radius value is composed of a reading control portion 22a, a memory 22b, and a magnification-correcting portion 22c as shown in FIG. 4. A table of various values of the radius r, the mean atomic number Z, and the accelerating voltage E is stored in the memory 22b as shown in FIG. 5. The radius r represents the size of the x-ray emissive region x as described in connection with FIG. 1. The mean atomic number Z and the accelerating voltage E are parameters. These combinations of various values of the radius r, the mean atomic number Z, and the accelerating voltage E are set empirically or theoretically.

As the specimen is irradiated with the electron beam, secondary electrons emanate from the specimen. The secondary electrons are detected by a detector 23. The output signal from the detector 23 is fed as an image signal to the control grid 14g of the CRT 14 via an amplifier 24 and an adder circuit 25.

Meanwhile, x-rays emitted from the specimen in response to the irradiation are analyzed by an energy-dispersive x-ray spectrometer 26 that comprises a semiconductor x-ray detector 27, a signal-producing circuit 28 such as a pulse-height analyzer, and a display device 31. A mean atomic number-calculating circuit 29 calculates the mean atomic number of the irradiated point on the specimen from the results of analysis made by the x-ray spectrometer 26. The calculated atomic number is sent to the aforementioned circuit 22 for producing a signal indicating a radius value.

In the operation of the apparatus built as described above, the accelerating voltage-selecting circuit 7 sets the accelerating voltage to $E_j$, for example. The magnification-selecting circuit 12 sets the magnification to for example. Then, the signal-selecting circuits 10x and 10y are switched to terminals. Thus, the scanning signals produced by the scanning circuits 8x and 8y are fed to the deflectors 4x and 4y via the magnification-switching circuit 11. The amplitudes of the input signals to the deflectors 4x and 4y are set according to the magnification $M_k$. Therefore, the specimen is raster-scanned with the electron beam at an amplitude according to the magnification $M_k$.

Secondary electrons are emitted from the specimen in response to the raster scan and detected by the detector 23. The output signal from the detector 23 is supplied as an image signal to the CRT 14 which is scanned in synchronism with the raster scan. As a result, an image of the specimen is displayed at the magnification $M_k$ on the screen as shown in FIG. 6(a).

The potentiometers 15x and 15y produce signals $X_i$ and $Y_j$, respectively, indicating an analyzed position. These signals are fed to the writing control circuit 20 via the A/D converter 16. In response to the incoming signals $X_i$ and $Y_j$, the control circuit 20 writes a value of 1 to the memory 19 at a location f' specified by $X=X_i$ and $Y=Y_j$. Data is read from the memory 19 by the reading control circuit 21 in synchronism with the scanning of the electron beam and sent to the CRT 14 via the D/A converter 17 and the adder circuit 25. Consequently, a bright (or dark) spot F, is superimposed on the image of the specimen on the screen of the CRT 14, as shown in FIG. 6(a). The bright spot F, can be moved into a location to be analyzed by operating the potentiometers 15x and 15y while observing the specimen image and the bright spot.

Subsequently, the signal-selecting circuits 10x and 10y are switched to terminals b. Under this condition, the signals $X_i$ and $Y_j$ from the potentiometers 15x and 15y are sent to the deflectors 4x and 4y, respectively, via the magnification-selecting circuit 11. Thus, the electron beam EB is fixed on a position on the specimen which corresponds to the position specified by the bright spot F' within the specimen image. In response to the irradiation, x-rays are produced from the vicinities of the irradiated point. The x-rays are guided to the energy-dispersive x-ray spectrometer 26 and analyzed. The display device 31 displays the results of quantitative and qualitative analyses of the irradiated point according to the output data from the spectrometer 26.

The mean atomic number-calculating circuit 29 calculates the mean atomic number $Z_i$ of the irradiated point on the specimen from the output data from the spectrometer 26. The calculated number $Z_i$ is sent to the circuit 22 for producing a signal indicative of a radius value. The reading control portion 22a reads the value $r_{ij}$ of the radius r taken under conditions of $Z=Z_i$ and $E=E_j$, from the table (FIG. 5) stored in the memory 22b, according to the incoming number $Z_i$ and the value $E_j$ of the accelerating voltage received from the accelerating voltage-setting circuit 7. The magnification-correcting portion 22c corrects the radius value $r_{ij}$ read out in this way, according to the data about the magnification $M_k$ sent from the magnification-selecting circuit 12. Finally, a corrected value $r_{ij}'$ is obtained. As an example, the correction consists in multiplying the radius value $r_{ij}$ by the magnification $M_k$.

The writing control circuit 22 writes a value of 1 to the memory 19 at locations surrounded by a circle f whose centers lies at the above-described location f', the circle f having the radius $r_{ij}'$, as shown in FIG. 3(b).

If the signal-selecting circuits 10x and 10y are switched back to the terminals the raster scan is restarted. An image of the specimen derived by the scan is presented on the viewing screen of the CRT 14. The bright spot F' and a circle F drawn about the spot are superimposed on the specimen image on the screen. The circle F indicates the x-ray emissive region. Therefore, the operator can see the position and the size of the analyzed region from this circle. Then, he or she can arbitrarily enlarge or narrow the analyzed region by varying the accelerating voltage.

While a preferred embodiment of the invention has been described, various changes and modifications will occur to those skilled in the art within the scope of the present inventive concepts. For example, the operator may enter the mean atomic number of the analyzed point into the radius value signal-producing circuit 22 through the use of an entry device after the atomic number is calculated from the output data from the energy-dispersive x-ray spectrometer.

If the mean atomic number of the analyzed point is known, then it is not necessary to find the mean atomic number in practice using the x-ray spectrometer. In this case, the operator may enter the known value into the radius value signal-producing circuit 22 through an entry device.

The present invention can also be applied to the case where backscattered electrons emitted from the specimen in response to irradiation of an electron beam are detected and analyzed. In this case, the table stored in the memory 22b is required to include data regarding the size of the region producing the backscattered electrons. Also, any of various position-specifying means such as a cross-hair cursor and a light pen may be used to specify the analyzed point. Furthermore, the invention is applicable to an apparatus which makes use of a charged-particle beam such as an ion beam instead of an electron beam, to irradiate and analyze a specimen.

Having thus defined my invention with the detail and particularity required by the Patent Laws, what is claimed and desired to be protected by Letters Patent is set forth in the following claims.

1. An apparatus utilizing a charged-particle beam for scanning a specimen in a two-dimensional manner and displaying an image of the specimen based upon x-rays or backscattered electrons emitted from the specimen on a display device having a viewing screen, said apparatus comprising:
 a position-specifying means for specifying a desired position within the image of the specimen and displaying that position as a first mark upon the viewing screen;
 a means for fixing the charged-particle beam on the position specified by the position-specifying means;
 a means for switching the accelerating voltage at which the beam is accelerated to at least one other value;
 a means for receiving the at least one other value of the accelerating voltage;
 a means for detecting the x-rays or backscattered electrons emitted from the specimen in response to the irradiation of the fixed beam;
 a means for receiving the mean atomic number of the irradiated portion of the specimen; and
 a second mark display means which superimposes a second mark indicating the position and the size of an analyzed region on the image of the specimen displayed on the viewing screen according to information indicating the accelerating voltage and information indicating the mean atomic number of the specimen.

2. The apparatus of claim 1, wherein said mark display means comprises;
 a storage means for storing a table of various combinations of values of the accelerating voltage, the mean atomic number, and the size of the region producing x-rays or backscattered electrons;
 a reading means for reading information about the size from the table in response to the combination of the information indicating the accelerating voltage and the information indicating the mean atomic number of the specimen; and
 a display means for displaying a mark that represents the size of the analyzed region according to the output from the correcting means.

3. An apparatus utilizing a charged-particle beam for scanning a specimen in a two-dimensional manner and displaying an image of the specimen based upon x-rays or backscattered electrons emitted from the specimen on a display device having a viewing screen, said apparatus comprising:
 a position-specifying means for specifying a desired position within the image of the specimen and displaying that position as a first mark upon the viewing screen;
 means for fixing the charged-particle beam on the position specified by the position-specifying means;
 a means for switching the accelerating voltage at which the beam is accelerated to at least one other value;
 a means for receiving the at least one other value of the accelerating voltage;
 a means for switching the magnification of the image of the specimen to at least one other value;
 a means for detecting the x-rays or backscattered electrons emitted from the specimen in response to the irradiation of the fixed beam;
 a means for receiving the mean atomic number of the irradiated portion of the specimen; and
 a second mark display means which superimposes a second mark indicating the position and the size of an analyzed region on the image of the specimen displayed on the viewing screen according to the information indicating the magnification of the image of the specimen, information indicating the accelerating voltage, and information indicating the mean atomic number of the specimen.

4. The apparatus of claim 3, wherein said mark display means comprises:
 a storage means for storing a table of various combinations of values of the accelerating voltage, the mean atomic number, and the size of the region producing x-rays or backscattered electrons;
 a reading means for reading information about the size from the table in response to the combination of the information indicating the accelerating voltage and the information indicating the mean atomic number of the specimen; and
 a display means for displaying a mark that represents the size of the analyzed region, according to the output from the correcting means.

* * * * *

UNITED STATES PATENT AND TRADEMARK OFFICE
CERTIFICATE OF CORRECTION

PATENT NO. : 4,894,541

DATED : January 16, 1990

INVENTOR(S) : Akishige Ono

It is certified that error appears in the above-identified patent and that said Letters Patent is hereby corrected as shown below:

Column 4 Line 36 "F," should read --F'--.

Column 4 Line 42 "Xi and Yj" should read --$X_i$ and $Y_j$--.

Column 5 Line 49 insert heading --What is claimed is:--.

Claim 3 Line 33 Column 6 before "means" insert --a--.

Signed and Sealed this

Twenty-fifth Day of December, 1990

*Attest:*

HARRY F. MANBECK, JR.

*Attesting Officer*  *Commissioner of Patents and Trademarks*